United States Patent [19]

Pickering

[11] 4,217,651
[45] Aug. 12, 1980

[54] ELECTRICAL MEASUREMENTS

[75] Inventor: John R. Pickering, Cawston, England

[73] Assignee: Datron Electronics Limited, Norwich, England

[21] Appl. No.: 968,849

[22] Filed: Dec. 12, 1978

[51] Int. Cl.² ........................................... G01R 13/00
[52] U.S. Cl. .................................... 364/571; 324/990; 364/483
[58] Field of Search ............. 364/571, 483; 324/99 D, 324/113, 99 R; 328/146

[56] References Cited

U.S. PATENT DOCUMENTS

| | | | |
|---|---|---|---|
| 4,000,643 | 1/1977 | Pearson | 364/571 X |
| 4,031,630 | 6/1977 | Fowler | 364/571 X |
| 4,041,288 | 8/1977 | Conway et al. | 364/483 |
| 4,091,543 | 5/1978 | Lapeyre | 364/571 X |

Primary Examiner—Edward J. Wise
Attorney, Agent, or Firm—Sherman & Shalloway

[57] ABSTRACT

A method of determining the uncertainty value of an electrical measuring instrument, such as a digital voltmeter. The method comprises the steps of storing digital data values representative of the accuracy specifications of the instrument as a function of the measured reading and as a function of the full scale reading and supplying the data values to a data processing apparatus. A digital value representative of a measured reading is also supplied to the data processing apparatus which is then arranged to calculate the uncertainty value of the measured reading and to display the calculated value. Apparatus for determining such an uncertainty value is also disclosed.

28 Claims, 3 Drawing Figures

ELECTRICAL MEASUREMENTS

BACKGROUND OF THE INVENTION

This invention relates to a method of and apparatus for determining the uncertainty value of a measured reading of an electrical measuring instrument.

DISCUSSION OF THE PRIOR ART

Measuring instruments have uncertainties in their measured reading which relate to any given reading in a quite complex way making it time consuming and difficult to predict the limits of error for any particular reading. Such uncertainties may be compounded by variables in:-
(a) the instrument—such as, different measurement ranges and functions, ageing of components and the period which has elapsed since the instrument was calibrated,
(b) the signal being measured—such as, frequency and waveform; and
(c) the environment—such as temperature.

The above, and other, variables will affect the accuracy of the measured reading of the instrument and the accuracy of an instrument is usually specified by the manufacturer.

In a digital instrument, such as a digital voltmeter, the indicated value of the least significant digit can be in error. The accuracy specification of such an instrument can be specified as $\pm(X\%R+Y\%F)$, that is the sum of $X\%$ of the magnitude of the input signal to be measured (often assumed to be the reading indicated by the instrument) and $Y\%$ of the full scale reading (F) of the range under concern. X and Y are variables dependent upon many factors including those aforementioned. The term $X\%R$ is thus dependent upon the magnitude of the input signal and the term $Y\%F$ is a fixed value for the range under consideration and, in a digital instrument, is sometimes expressed as a number of digits of error. A sophisticated digital voltmeter may have as many as 25 range/function combinations and these combinations could have different accuracy specifications so that it will be realised that the calculation of the uncertainty of the reading can be time consuming and tedious. Some digital voltmeters can determine the ratio between the magnitudes of two input signals and the uncertainty is then a function of the individual readings and their ratio. This is a complex error function.

It is possible to compute the uncertainties by looking up the appropriate specification for the particular range/function combination, and the particular signal characteristic and environmental condition as described and performing the appropriate calculation but as stated the computation is time consuming and tedious.

It is an object of the invention to provide a method of and apparatus for automatically calculating the uncertainty value of a measured reading of an electrical measuring instrument.

SUMMARY OF THE INVENTION

According to the invention, there is provided a method of determining the uncertainty value of the measured reading of an electrical measuring instrument comprising the steps of storing digital data values representative of the accuracy specifications of the instrument as a function of the measured reading and as a function of the full scale reading, supplying to a calculating apparatus said data values and a digital value representative of the measured reading, causing the apparatus to calculate the said uncertainty value and displaying the calculated uncertainty value.

Further according to the invention there is provided data processing apparatus for determining the uncertainty value of the measured reading of a measuring instrument, the apparatus comprising storage means for storing data values representative of the accuracy specifications of a measuring instrument with which it is to be used, calculating apparatus and control means for controlling operation of the calculating apparatus and a measuring instrument coupled, in use, to the apparatus, the control means being arranged to effect read-out of said data values from said storage means into said calculating apparatus, to cause the measuring instrument to effect a measurement and supply a digital value representative of the measured reading to the calculating apparatus and to cause the calculating apparatus to calculate the said uncertainty value from the data values and the measured value.

DESCRIPTION OF THE DRAWINGS

The invention will now be described by way of example with reference to the accompanying drawings, in which.

DETAILED DESCRIPTION OF THE INVENTION

Figure 1:
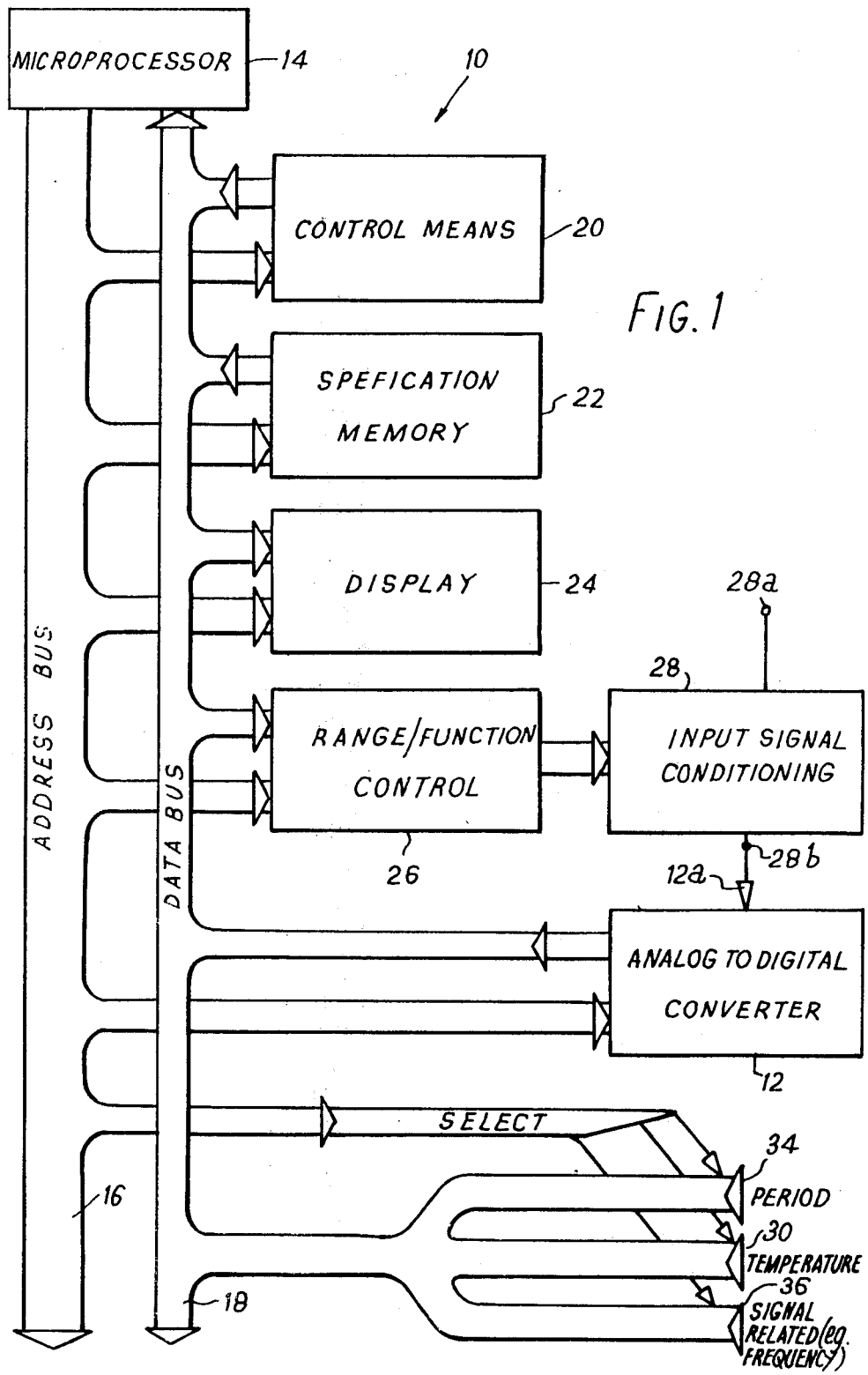
FIG. 1 is a block schematic diagram of one embodiment of apparatus according to the invention for determining the uncertainty value of the reading of a digital voltmeter.

Referring to FIG. 1 of the drawings, there is shown a data processing apparatus 10 arranged to control an analog to digital converter (ADC) 12 arranged to function as a digital voltmeter. The apparatus 10 comprises a microprocessor 14, such as that sold by Motorola under the type number MC6800, which is coupled to the various parts of the apparatus 10 and the ADC 12 by means of an address bus 16 and a data bus 18; information passing along a bus in a direction as indicated by appropriate arrow. A control means 20 comprising a control program store is arranged to control operation of the microprocessor 14. The microprocessor may and probably will, have many functions to perform but the following description will be limited to its function in controlling the ADC 12 and the determination of the uncertainty value of the conversion by the ADC 12 of an analog input signal to the equivalent digital value.

A storage means 22 such as a semi-conductor memory is arranged to store the accuracy specification of the ADC 12 and is coupled to the microprocessor 14 by way of the address bus 16 and data bus 18 as shown.

The microprocessor is coupled by way of the buses 16, 18 to a display means 24 arranged to display the measured reading and the uncertainty value of the reading and to a range and/or function control means 26, arranged to select the appropriate range and function of the ADC 12 and to control an input signal conditioning circuit 28. The circuit 28 has an input terminal 28a for an input analog electrical signal to be measured and an output terminal 28b connected to the input 12a of the ADC 12.

The microprocessor 14 is also coupled by way of the address bus 16 to select information relating to the ambient temperature at the ADC 12 on terminal 30; the characteristics of the input signal, for example its frequency, on terminal 32; and the condition of the ADC 12, for example the period which has elapsed since it was calibrated, on terminal 34; the selected information being transferred to the microprocessor by way of the data bus 18.

The ADC 12, range and/or function control means 26, signal conditioning means 28, and display means 24 can be incorporated in the same apparatus as a digital voltmeter, and, indeed, the whole system 10 can be arranged as a single apparatus.

The control means 20 can be arranged to control the microprocessor in a variety of ways and two preferred ways will now be described by way of example.

Figure 2:
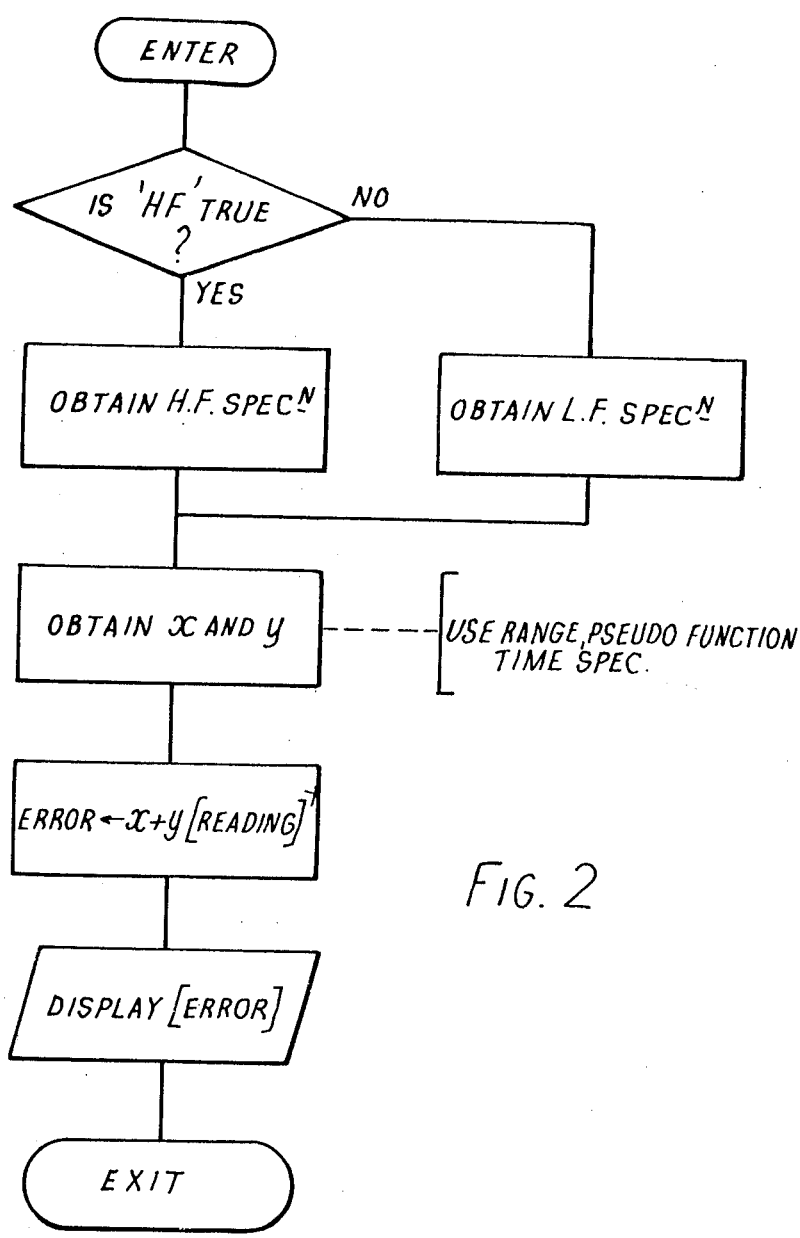
FIG. 2 is a flow chart of one method according to the invention for determining the said uncertainty value.

Referring now to FIG. 2, there is shown a flow chart of a method according to the invention for determining the uncertainty value of a reading made by the ADC 12. In the method to be described, a plurality of accuracy specifications of the ADC 12 are stored in the storage means for a plurality of sets of conditions, such as environmental conditions at the ADC 12, the condition of the ADC and the input signal to be converted. Typically, the specifications for three combinations of ambient temperature and time periods since the ADC was calibrated can be stored, for example 24 hours and $\pm 1°$ C. deviation from nominal ambient temperature; 90 days and $\pm 5°$ C. and 1 year and $\pm 15°$ C. The nominal temperature is typically 20° C. Furthermore, the above specification can be stored for different kinds of input signal, for example, one being d.c. or having alternating components below a predetermined frequency and one having an alternating component equal to or greater than the said predetermined frequency.

In operation of the apparatus 10, the control means commands the microprocessor 14 to start a measurement cycle. The microprocessor 14 sets or determines the range and/or function of the ADC 12 and addresses the three terminals 30, 32 and 34 to determine the ambient temperature at the ADC, the period which has elapsed since the ADC was calibrated and the characteristic of the input signal as aforementioned. This information is fed by way of data bus 18 to the microprocessor 14 whereby the instrument specification nearest to the conditions indicated at terminals 30, 32 and 34 is read out from the storage means 22 into the microprocessor. Thus the appropriate valves of X and Y are available in the microprocessor.

The control means 20 then causes the microprocessor to command the ADC to convert the analog input signal at terminal 28a to an equivalent digital value and to transmit the digital value to the microprocessor, the converted (or measured) value being displayed on display means 24.

The microprocessor 14 is also commanded to determine the uncertainty value of the measured reading, and this can be acheived in any one of a number of well known ways. For example, the value of X could be multiplied by the measured value R and the product added to the value of Y multiplied by the full scale value for the selected range (Y.F. being a constant for a selected range).

However, the function $\pm(XR+YF)$ can be manipulated to $\pm(X+Y\cdot F/R)$ R and by modifying the stored value of Y, F can be rationalised to unity so that the uncertainty function simplifies to $\pm(X+Y/R)\%$ of the indicated value of the input signal that is, of R. Such an arithmetic calculation can be readily programmed in the microprocessor. Thus the microprocessor is caused to determine the uncertainty value as a percentage of the measured value and to display it, either simultaneously or sequentially with the measured value, on the display means 24. In the calculation X and Y are assumed to be of the same polarity to give the worst case error.

For the calculated ratio of two readings it can be shown, using the binomial thereon and assuming that the individual measurement uncertainties for both numerator and divisor are small, that the total %R uncertainty of the calculated ratio is given by $$\left[ X_1 + \frac{Y_1}{R_1} - \left( X_2 + \frac{Y_2}{R_2} \right) \right] \% \text{ of reading}$$

where:

$X_1$, $Y_1$ are specifications for numerator reading $R_1$ $X_2$, $Y_2$ are specifications for denominator reading $R_2$ In this case $X_1$ and $Y_1$ are assumed to be of opposite polarity to $X_2$ and $Y_2$ in order to give the worst case error. It may be desirable, however, to modify this assumption for the case where both $R_1$ and $R_2$ are measured on the same range and function using the same circuit. Under these conditions X and Y will be nearly the same for both readings if very little noise is present and both readings are taken within a very short time. The ratio uncertainty will be very much reduced in practice and therefore the specified uncertainty can be calculated in a modified manner to give a more realistic indication of the measured uncertainty.

FIG. 2 shows a simple flow chart of a typical programme for carrying out the method as aforementioned. To determine the uncertainty value of a reading it is necessary to read-out from the storage means 22, the specification values X and Y appropriate to the conditions indicated at terminals 30, 32 and 34. The signal characteristic at terminal 32 is entered and the microprocessor determines whether or not the input signal has a high frequency component; if it has a first decision is made to select the appropriate high frequency specification values X and Y; if not, the appropriate low frequency specification values X and Y are selected. In addition, the signals at terminals 30 and 34 and signals indicative of the range and function of the data are fed into the microprocessor to enable it to select the appropriate X and Y values. Having selected X and Y the microprocessor is commanded to obtain the uncertainty percentage value of the reading by manipulation of the function $\pm(X+Y/R)$ and to display the determined value on the display means 24, for a predetermined time and then an 'exit' signal is fed to the control means 22 to cause the latter to step to its next operation.

Figure 3:
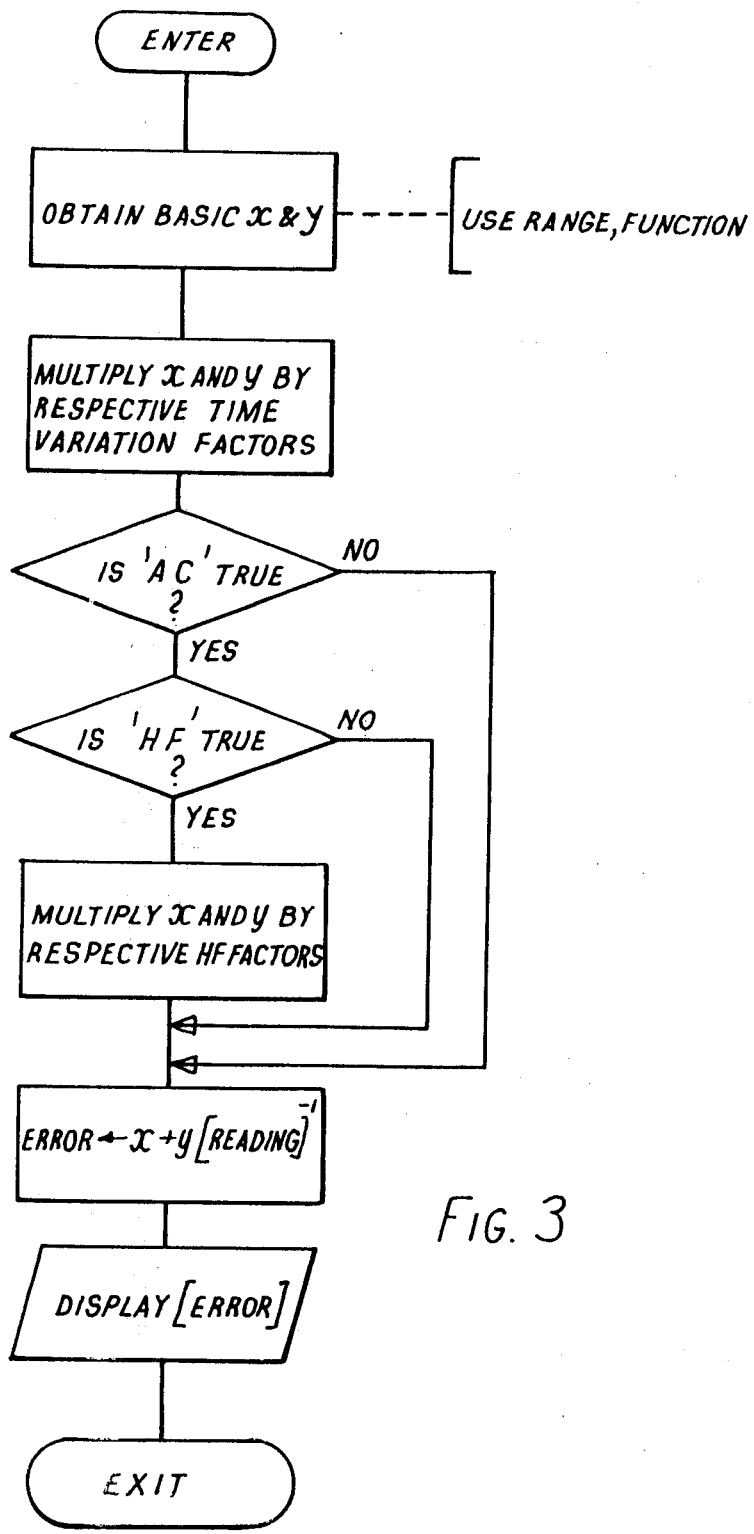
FIG. 3 is a flow chart of another method according to the invention for determining the said uncertainty value.

FIG. 3 shows a flow chart of another programme for carrying out the method according to the invention. In this method the basic values of X and Y for the appropriate range and/or function of the ADC 12 are read into the microprocessor 14 from the storage means 22 and then the microprocessor is arranged to modify the values of X and Y according to the information received from terminals 30, 32 and 34 before computing and displaying the uncertainty value. It will be realised that the performance of the ADC 12 for variations in the characteristic such as those available at terminals 30, 32 and 34 can be predetermined and the microprocessor could be programmed to perform the necessary modifications in a variety of ways dependent inter alia on the microprocessor used. The actual method of manipulation does not form part of the invention and a detailed description is believed unnecessary. However, a brief example will be given of the way in which the values of X and Y can be modified in dependence upon a change in the ambient temperature at the instrument. Suppose that the specifications stored are $X_o$, $Y_o$ for a particular temperature, $T_o$ and that the specified or known temperature coefficients of X and Y are also stored in store 22. These coefficients are $dX/dT$ and $dY/dT$.

The worst case values for X and Y at a particular temperature T are $X_T$ and $Y_T$ and can be calculated in microprocessor 14 provided the ambient temperature T can be measured.

$$X_T = X_o + (T - T_o)dX/dT$$

$$Y_T = Y_o + (T - T_o)dY/dT$$

The modified values $X_T$ and $Y_T$ may then be used in the manner described.

Similarly, a plurality of sets of data values for X and Y could be stored corresponding to an input signal to be measured comprising d.c. and/or alternating signals having a range of different bandwidths.

I claim:

1. In a method of operating an electrical measuring instrument selectively measuring the magnitude of an input electrical signal and determining the uncertainty value of the measured reading of the input signal, the improvement comprising the steps of storing digital data values representative of the accuracy specifications of the instrument as a function of the measured reading and as a function of the full scale reading, supplying to a calculating apparatus said data values and a digital value representative of the measured reading, causing the apparatus to calculate the said uncertainty value and selectively displaying the measured value of the input signal and the calculated uncertainty value of the measured signal.

2. A method according to claim 1, in which the measuring instrument has a plurality of pre-selectable ranges or functions or both, and the step of storing said data values comprises the step of storing at least two sets of data values dependent upon the accuracy specifications of each range and/or function and the step of supplying said data values comprises the step of selecting the set of data values appropriate to the selected range and/or function.

3. A method according to claim 1 or 2, in which the step of storing said data values representative of the accuracy specification comprises the step of storing at least two sets of said values dependent upon at least two predetermined environmental conditions at the measuring instrument and the step of supplying the said data values comprises the step of determining the environmental condition at the instrument and selecting a set of said stored data values for an environmental condition nearest to said determined environmental conditions.

4. A method according to claim 3, in which the said predetermined environmental conditions comprise a first range of temperature about a predetermined nominal value of ambient temperature and at least a second, higher range of temperature about said nominal value.

5. A method according to claim 1 or 2, in which the said data values are representative of the accuracy specifications of the instrument at a predetermined nominal environmental condition at the instrument and the method further comprises: (a) the steps of supplying to the calculating apparatus a value dependent upon the said environmental condition at the measuring instrument and causing the apparatus to modify the said data values, if the supplied value of the environmental condition deviates a predetermined amount, or amounts, from said nominal value, before the step of calculating the said uncertainty value; (b) the steps of supplying to the apparatus a value dependent upon the condition of the instrument and causing the apparatus to modify the said data values in accordance with said value dependent upon instrument condition before the step of calculating said uncertainty value; (c) the steps of supplying to the calculating apparatus a value dependent upon a characteristic of the signal to be measured by the instrument, and causing the apparatus to modify the said data values, if the said signal characteristic differs from a predetermined characteristic, before the step of calculating the said uncertainty value.

6. A method according to claim 5, in which the said environmental condition is the ambient temperature at the instrument.

7. A method according to claim 5, in which the said instrument condition is defined as the time period which has elapsed since the instrument was calibrated.

8. A method according to claim 5, in which the said signal characteristic is frequency and the apparatus is caused to modify the said data values if the signal to be measured includes an alternating component.

9. A method according to claims 1 or 2, in which the calculating apparatus is arranged to control operation of the various steps of the method.

10. A method according to claims 1 or 2, in which said data values are in the form of two digital numbers X and Y, wherein X and Y are multipliers in an equation of the general form, uncertainty value = $\pm(X \cdot R + YF)\%$, wherein R is the measured reading and F is the full scale reading of the range of concern in the instrument.

11. A method according to claim 10, in which the value of F is normalised to unity and the apparatus is caused to calculate the value of $(X + Y/R)$ to provide an indication of the uncertainty of the measured reading.

12. A method according to claims 1 or 2 in which the step of storing said data values representative of the accuracy specification comprises the step of storing at least two sets of values dependent upon the condition of the measuring instrument and the step of supplying said data values comprises the step of selecting the set of data values appropriate to the condition of the instrument.

13. A method according to claim 12, in which the said conditions of the instrument are defined as time periods which have elapsed since the instrument was calibrated.

14. A method according to claims 1 or 2 in which the step of storing said data values representative of the accuracy comprises the step of storing at least two sets of values dependent upon a characteristic of the electrical signal to be measured by the instrument, and the step of supplying the said data values comprises the step of determining the characteristic of the signal to be measured and selecting a set of data values corresponding to said determined characteristic.

15. A method according to claim 14, in which the signal characteristic is frequency, a first set of data values being selected if the signal has substantially no alternating components and a second set of data values being selected if the signal has an alternating component.

16. A method according to claim 15, in which a third set of data values is selected if the signal has an alternating component of frequency greater than a predetermined value.

17. A measuring device for measuring the value of an input electrical signal comprising:
a data processing apparatus for determining the uncertainty value of the measured reading of the input electrical signal, the apparatus comprising:
storage means for storing data values representative of the accuracy specifications of a measuring instrument with which it is to be used,
a calculating apparatus and control means for controlling operation of the calculating apparatus;
a measuring instrument coupled, in use, to the apparatus;
the control means reading out said data values from said storage means into said calculating apparatus, thereby causing the measuring instrument to effect a measurement and supply a digital value representative of the measured reading to the calculating apparatus and further causing the calculating apparatus to calculate the said uncertainty value from the data values and the measured value; and
display means and means for selectively displaying the measured value of the input electrical signal and the uncertainty of the measured signal.

18. Apparatus according to claim 17, in which the storage means is arranged to store at least two sets of said data values dependent upon at least two predetermined environmental conditions at the measuring instrument and further comprising means for determining the said environmental condition and for selecting a set of said stored data values nearest to said determined environmental conditions.

19. Apparatus according to claim 18, in which said means for determining said environmental condition comprises means for determining the ambient temperature at the measuring instrument and said two sets of data values comprise a first set appropriate to a first range of temperature about a predetermined nominal value of ambient temperature and a second set appropriate to a second, higher range of temperature about said nominal value.

20. Apparatus according to any one of claims 18, 18 or 20 in which the storage means is arranged to store at least two sets of said data values dependent upon the condition of the measuring instrument, the apparatus further comprising means for supplying to said calculating apparatus a signal dependent upon the condition of the measuring instrument and means responsive to said last mentioned signal to select a set of data values appropriate to the condition of the instrument.

21. Apparatus according to claims 17 or 18, in which the measuring instrument has a plurality of preselectable ranges and/or functions and the storage means is arranged to store at least two sets of data values appropriate to the accuracy specification of the instrument for the said ranges and/or functions and the control means is arranged to readout data values appropriate to the selected range and/or function.

22. Apparatus according to claim 16, in which the storage means is arranged to store at least two sets of data values dependent upon a characteristic of the electrical signal to be measured by the instrument, and the apparatus comprises means for determining the characteristic of the signal to be measured and for selecting a set of data values corresponding to said determined characteristic.

23. Apparatus according to claim 22, in which the signal characteristic is frequency and the storage means is arranged to store a first set of data values appropriate to an input signal having no alternating components or alternating components of frequency less than a predetermined value and a second set of data values appropriate to an input signal having an alternating component of frequency equal to or greater than said predetermined value.

24. Apparatus according to claim 17, in which the data values stored in said storage means are representative of the accuracy specifications of the instrument at a predetermined nominal environmental condition at the instrument and the apparatus comprises means for supplying a signal dependent upon said environmental condition to said apparatus and means responsive to said last mentioned signal for causing the apparatus to modify the said data values if the supplied value of the environmental condition deviates a predetermined amount, or amounts, from said nominal value.

25. Apparatus according to claim 24, in which said means for determining said environmental condition is arranged to determine the ambient temperature at the measuring instrument.

26. Apparatus according to claims 17, 18, 22 or 24, further comprising means for determining a condition of the instrument and for modifying the said data values readout from said storage means in accordance with said instrument condition before calculating the said uncertainty value.

27. Apparatus according to claim 17 further comprising means for supplying to the calculating apparatus a signal value dependent upon a characteristic of the signal to be measured by the instrument and for causing the apparatus to modify the said data values if the said signal value differs from a predetermined characteristic.

28. Apparatus according to claim 27, in which the said means for supplying said signal dependent upon a characteristic of the signal to be measured comprises means for detecting whether the said signal has an alternating component.

* * * * *